(12) United States Patent
Lee et al.

(10) Patent No.: US 7,525,847 B2
(45) Date of Patent: Apr. 28, 2009

(54) SEMICONDUCTOR DEVICE AND METHODS OF MANUFACTURING THE SAME

(75) Inventors: Soo-Cheol Lee, Seoul (KR); Ki-Jik Lee, Osan-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 221 days.

(21) Appl. No.: 11/282,806

(22) Filed: Nov. 18, 2005

(65) Prior Publication Data

US 2006/0109709 A1 May 25, 2006

(30) Foreign Application Priority Data

Nov. 19, 2004 (KR) ................ 10-2004-0094891

(51) Int. Cl.
*G11C 16/04* (2006.01)
(52) U.S. Cl. .................. 365/185.28; 365/185.29; 365/185.24; 365/177
(58) Field of Classification Search ........... 365/185.28, 365/185.29, 185.18, 185.24, 185.17, 177; 257/314, E21.679, E21.682
See application file for complete search history.

(56) References Cited

U.S. PATENT DOCUMENTS

| 5,837,584 | A | 11/1998 | Lu et al. ............... 438/263 |
| 5,940,324 | A | 8/1999 | Chi et al. ............. 365/185.27 |
| 6,646,924 | B1 * | 11/2003 | Tsai et al. ............ 365/185.28 |
| 6,653,183 | B2 | 11/2003 | Hung et al. ............ 438/211 |
| 6,730,969 | B1 * | 5/2004 | Padmanabhan et al. .... 257/356 |
| 2004/0008561 | A1 | 1/2004 | Lee et al. ............. 365/222 |

* cited by examiner

*Primary Examiner*—David Lam
(74) *Attorney, Agent, or Firm*—F. Chau & Associates, LLC

(57) ABSTRACT

A semiconductor device includes at least two transistors and a charge-trapping structure. The charge-trapping structure traps charges, which are moved from a selected transistor toward a non-selected transistor, adjacent to the selected transistor among the transistors, thereby preventing a threshold voltage of the non-selected transistor from being increased. Thus, the charge-trapping structure traps the charges so that an increase of the threshold voltage of the non-selected voltage is suppressed.

26 Claims, 9 Drawing Sheets

US 7,525,847 B2

SEMICONDUCTOR DEVICE AND METHODS OF MANUFACTURING THE SAME

CROSS REFERENCE TO RELATED APPLICATION

This application claims priority under 35 USC § 119 to Korean Patent Application No. 2004-94891, filed on Nov. 19, 2004, the contents of which are herein incorporated by reference in its entirety for all purposes.

BACKGROUND OF THE INVENTION

1. Field of the Invention

The present invention relates to a semiconductor device and to methods of manufacturing the semiconductor device. More particularly, the present invention relates to a non-volatile memory device that is capable of being programmed once, and to methods of manufacturing the non-volatile memory device.

2. Description of the Related Art

Recently, the demand for liquid crystal display (LCD) driver integrated circuit (IC) (hereinafter referred to as an LDI) mobile devices has greatly increased. To reduce manufacturing costs, the LDI, a COM and SEG driver circuit and a power circuit have been integrated into a single chip. Also, two CMOS (Complementary Metal Oxide Semiconductor) structures including a high voltage transistor and a low voltage transistor, respectively, are installed in the LDI. Further, to operate the LDI in accordance with requirements of prospective users, a small one-time-programmable (OTP) cell is provided to the LDI.

The OTP cell includes an electrically erasable programmable read-only memory (EEPROM) that is programmed one time and is also erased using an ultraviolet ray. Particularly, the OTP cell includes a cell having a single-poly EEPROM structure. The cell having the single-poly EEPROM structure has good operational characteristics and is also manufactured by simple processes. On the contrary, a unit cell of the cell having the single-poly EEPROM structure occupies a large area compared to a stack type structure. However, since the OTP cell includes between several to literally hundreds of bits of a plurality of cells, the area of the unit cell is of lesser importance.

Hereinafter, operations of the single-poly EEPROM structure are illustrated.

In a method of erasing data in the cell, a wafer is irradiated with an ultraviolet ray on which unit cells have the single-poly EEPROM structure to neutralize charges in a floating gate. The neutralized charges are moved toward the wafer to erase the data in the cell. Here, a transistor of the cell in which the data is erased has a threshold voltage lower than an operation voltage Vcc. This state is referred to as an "on-state". Also, the threshold voltage is about 1V to about 2V.

On the contrary, in a method of programming data in the cell, hot electrons are injected into the cell through a gate oxide layer to charge charges in the floating gate electrode, thereby programming the cell. The transistor of the programmed cell has a threshold voltage higher than an operation voltage. This state is referred to as an "off-state". Also, the threshold voltage is about 6V to about 8V.

However, when the unit cells having the single-poly EEPROM structure are arrayed, the hot electrons excessively generated in programming the cell are moved into an adjacent cell so that they become trapped in an adjacent floating gate electrode. When the hot electrons are trapped in the adjacent floating gate electrode, a threshold voltage of the adjacent floating gate electrode is increased. This phenomenon is referred to as a gate disturbance.

FIG. 1 is a graph illustrating the phenomenon of gate disturbance.

A voltage of about 15V was applied to a control gate of the cell. Also, an operation voltage of about 5V was applied to the cell to program the cell. Variances of threshold voltages of the programmed cell and an adjacent cell were measured. In FIG. 1, reference numeral 10 represents the threshold voltage of the programmed cell, reference numeral 12 indicates the threshold voltage of the adjacent cell, and reference numeral 14 represents the threshold voltage of a cell that is not adjacent to the programmed cell.

As shown in FIG. 1, when the time for programming the cell is increased, the threshold voltage 12 of the adjacent cell is proportionally increased. On the contrary, the threshold voltages 10 and 14 of the programmed cell and the cell that is not adjacent to the programmed cell are virtually unchanged.

That is, when the gate disturbance of the cell is deteriorated, an undesired cell as well as a desired cell are programmed.

SUMMARY OF THE INVENTION

Exemplary embodiments of the present invention provide a semiconductor device that is capable of operating a selected cell without a cell, adjacent to the selected cell, being influenced.

Exemplary embodiments of the present invention also provide a method of manufacturing the above-mentioned semiconductor device.

A semiconductor device in accordance with an exemplary embodiment of the present invention includes at least two transistors and a charge-trapping structure. The charge-trapping structure traps charges, which are moved from a selected transistor toward a non-selected transistor, adjacent to the selected transistor among the transistors, thereby preventing a threshold voltage of the non-selected transistor from being increased.

A semiconductor device in accordance with another exemplary embodiment of the present invention includes a plurality of unit cells and a charge-trapping structure. Each of the unit cells includes an access transistor and a well for a control gate electrode spaced apart from the access transistor. A voltage is applied to the gate through the well. The charge-trapping structure traps charges from a selected cell, which are moved toward a non-selected unit cell, adjacent to the selected unit cell among the unit cells, thereby preventing a threshold voltage of the non-selected transistor from being increased.

In a method of manufacturing a semiconductor device in accordance with still another exemplary embodiment of the present invention, a plurality of unit cells are formed on a substrate. Each of the unit cells includes an access transistor and a well for a control gate electrode spaced apart from the access transistor. A voltage is applied to the gate through the well. The charge-trapping structure is formed in a selected unit cell among the unit cells. The charge-trapping structure traps charges from a selected unit cell, which are moved toward a non-selected unit cell, adjacent to the selected unit cell, thereby preventing a threshold voltage of the non-selected transistor from being increased.

According to at least one exemplary embodiment of the present invention, when the selected cell is programmed, the excess hot electrons are drained through the charge-trapping structure so that the threshold voltage of the non-selected cell, adjacent to the selected cell, is not increased, thereby providing a semiconductor device having improved operational characteristics and reliability over conventional devices.

BRIEF DESCRIPTION OF THE DRAWINGS

The above and other features and advantages of the exemplary embodiments of the invention will become readily apparent by reference to the following detailed description when considered in conjunction with the accompanying drawings wherein.

DESCRIPTION OF THE EMBODIMENTS

Figure 1:
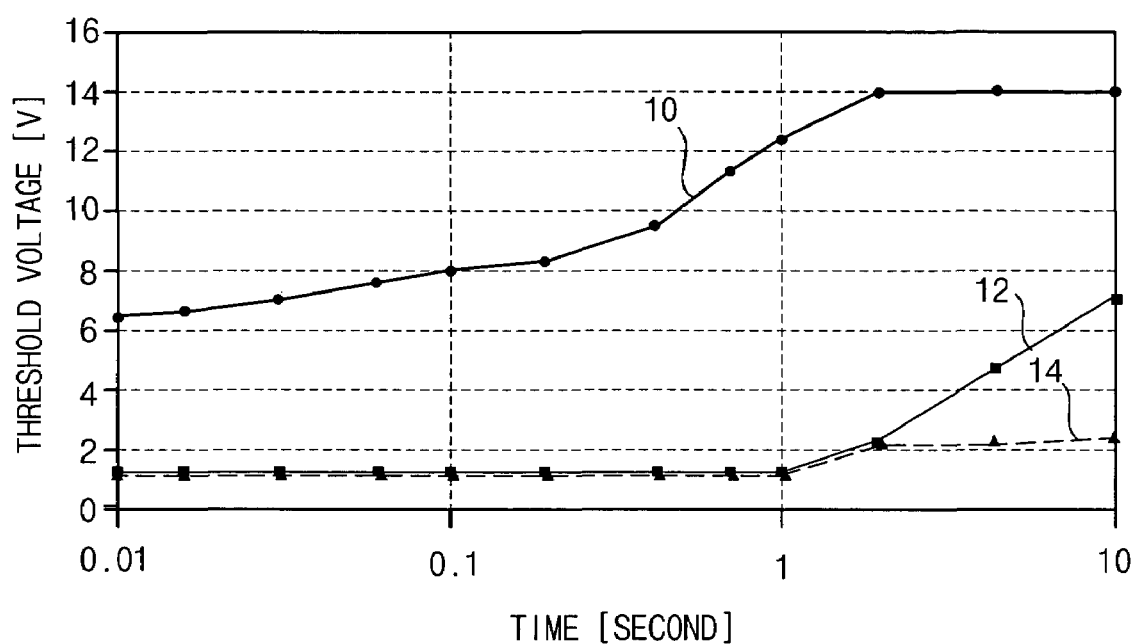
FIG. 1 is a graph illustrating a gate disturbance.

The exemplary embodiments of the present invention are described more fully hereinafter with reference to the accompanying drawings, in which embodiments of the invention are shown. This invention may, however, be embodied in many different forms and should not be construed as limited to the embodiments set forth herein. In the drawings, the sizes and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Moreover, the term "heavily doped" as used herein refers to a higher than average concentration of doping impurities. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Figure 2:
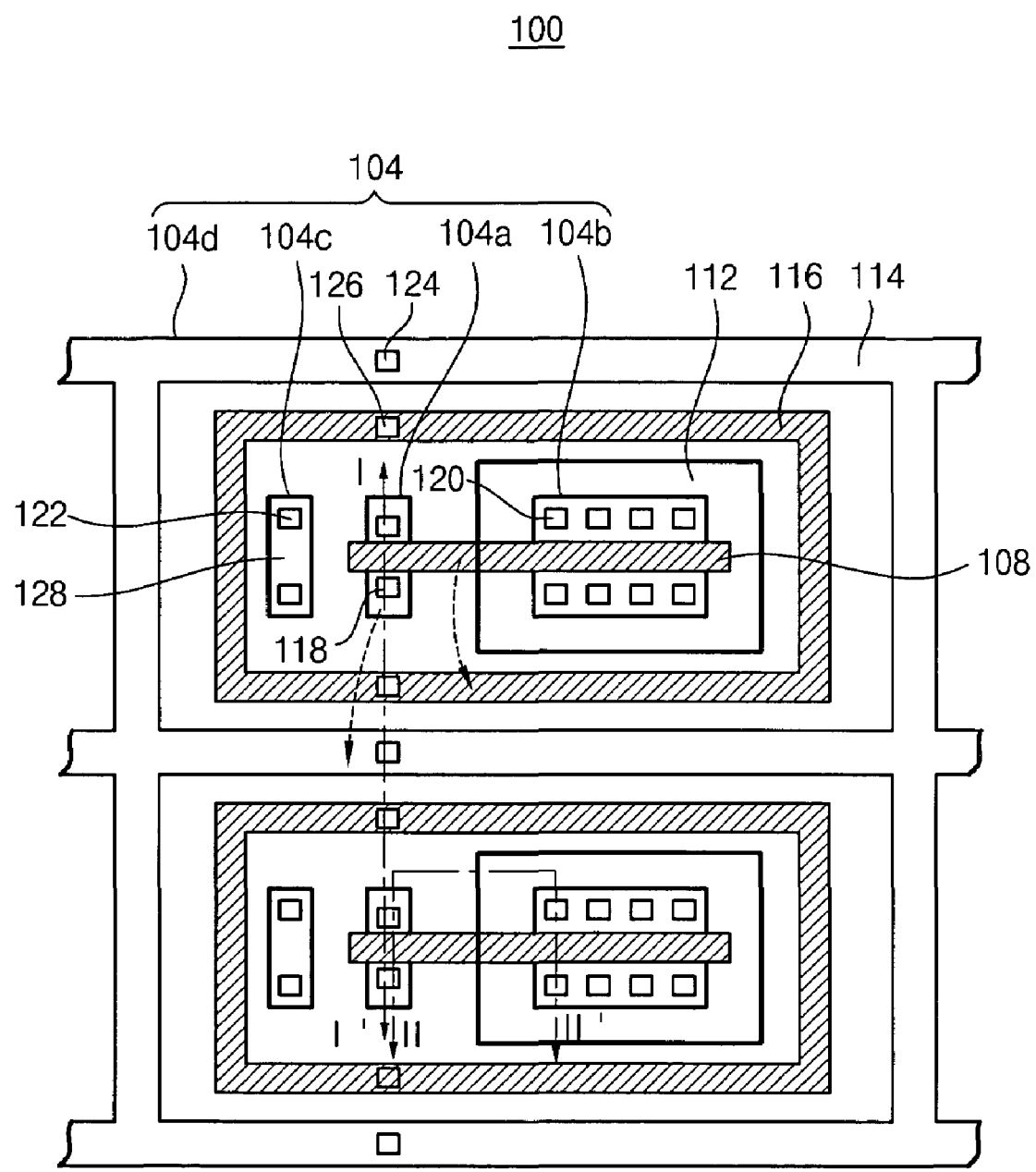
FIG. 2 is a plan view illustrating a single-poly EEPROM device in accordance with an exemplary embodiment of the present invention.
Figure 3:
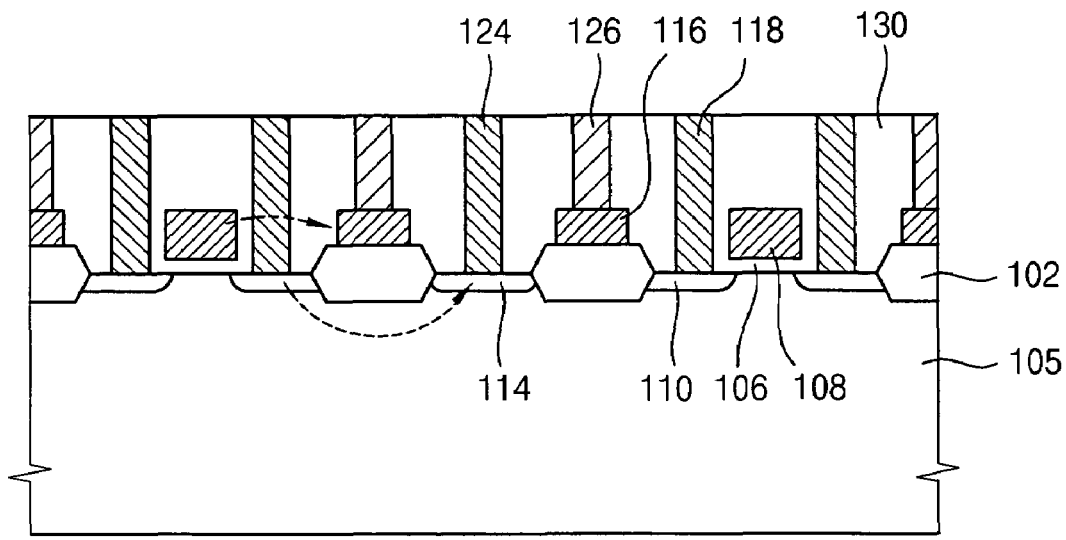
FIG. 3 is a cross sectional view taken along a line I-I' in FIG. 2.
Figure 4:
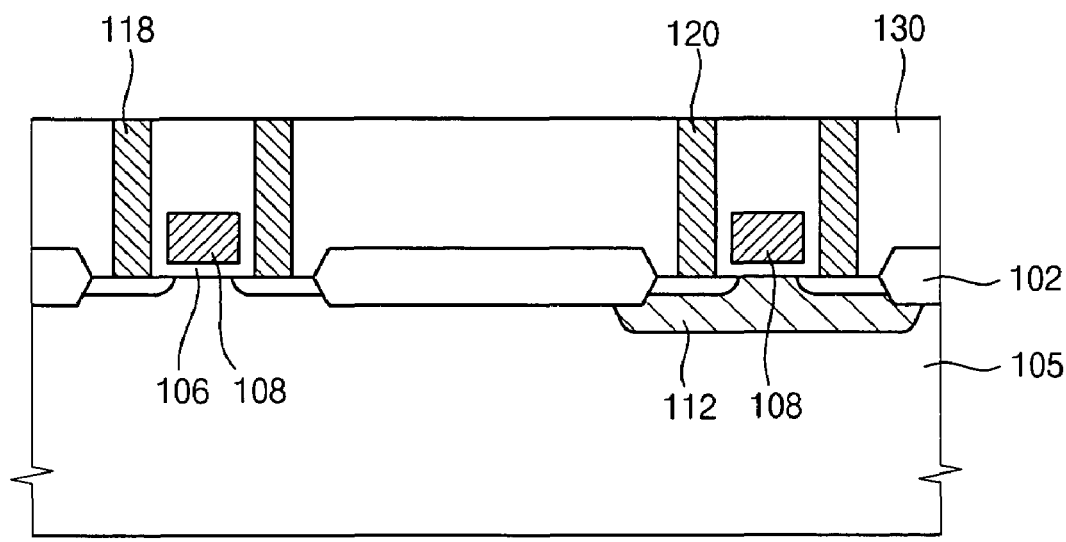
FIG. 4 is a cross sectional view taken along a line II-II' in FIG. 2.

FIG. 2 is a plan view illustrating a single-poly EEPROM device in accordance with a first exemplary embodiment of the present invention, FIG. 3 is a cross sectional view taken along a line I-I' in FIG. 2, and FIG. 4 is a cross sectional view taken along a line II-II' in FIG. 2.

Referring to FIGS. 2 to 4, isolation layers 102 are formed on a semiconductor substrate 105 to define an active region 104 and a field region of the semiconductor substrate 105. The semiconductor substrate 105 is thermally oxidized to form the isolation layers 102. Alternatively, trenches of the semiconductor substrate may be filled with a silicon nitride layer to form the isolation layers 102.

The active region 104 includes first, second, third and fourth isolated active regions 104a, 104b, 104c and 104d. The first, second and third active regions 104a, 104b and 104c are formed in each unit cells. An access transistor is formed in the first active region 104a. A well 112 for a control gate electrode is formed in the second active region 104b. A ground voltage is applied to the third active region 104c.

The fourth active region 104d is formed between the unit cells. In particular, the fourth active region 104d encloses each of the unit cells. A charge-trapping well 114 is formed in the fourth active region 104d.

The access transistor in the first active region 104a includes a gate structure and source/drain regions 110 formed in portions of the semiconductor substrate 105 between the gate structures. The gate structure includes a gate insulation layer 106 and a floating gate electrode 108. The access transistor corresponds to an N type transistor. Also, the floating gate electrode 108 includes polysilicon. Hereinafter, the following illustrations will be described under a condition that the access transistor corresponds to the N type transistor.

A voltage is applied to the floating gate electrode 108 through the well 112 for the control gate electrode in the second active region 104b. The well 112 is heavily doped with N type impurities.

Here, as shown in FIGS. 2 to 4, since the control gate electrode is not formed on the floating gate electrode 108, a single conductive layer pattern as the floating gate electrode 108 is provided in the unit cell. As a result, a deposition process and a patterning process generally used in forming the control gate electrode, and which are required in the formation of a stack type non-volatile memory device, are omitted here. Consequently, the costs for manufacturing the semiconductor device are reduced.

The gate insulation layer 106 and the floating gate electrode 108 of the access transistor extend over the well 112 for the control gate electrode. Thus, the voltage applied to the well 112 for the control gate electrode is partially applied to the floating gate electrode 108 so that the floating gate electrode 108 has a voltage higher than a threshold voltage. As a result, the access transistor is turned on to generate hot electrons. The hot electrons are then injected into the floating gate electrode 108.

A ground well 128 is formed in the third active region 104c. The ground well 128 is doped with impurities having a conductive type different from that of impurities in the source/drain regions 110. In the present exemplary embodiment, the ground well 128 is doped with P type impurities.

A charge-trapping well 114 is formed in the fourth active region 104d. The charge-trapping well 114 traps hot electrons, which cross the isolation layer 102 under the surface of the semiconductor substrate 105. Among these trapped hot electrons are excess hot electrons that are generated in a selected cell during programming of the selected cell. Impurities may be implanted into the fourth active region 104d to form the charge-trapping well 114. Here, since the fourth active region 104d encloses each of the unit cells, the charge-trapping well 114 also encloses each of the unit cells.

The impurities in the charge-trapping well 114 may have a conductive type substantially identical to that of the impurities in the source/drain regions 110. That is, since the access transistor corresponds to the N type transistor, the charge-trapping well 114 is doped with N type impurities. Alternatively, the impurities in the charge-trapping well 114 may have a conductive type different from that of impurities in the source/drain regions 110.

The isolation layers 102 are positioned at both sides of the fourth active region 104d. Charge-trapping patterns 116 are formed on the isolation layers 102. The charge-trapping patterns 116 enclose each of the unit cells. The charge-trapping patterns 116 include a conductive material. In particular, the charge-trapping patterns 116 include a conductive material substantially identical to that of the floating gate electrode 108 of the access transistor.

An insulation interlayer 130 is formed on the floating gate electrode 108 and the semiconductor substrate 105. A first contact 118 for applying a voltage to the source/drain regions 110 and a second contact 120 for applying a voltage to the well 112 for a control gate electrode are formed through the insulation interlayer 130. Also, a third contact 122 for applying a ground voltage to the ground well 128 is electrically connected to the ground well 128.

To drain charges in the charge-trapping well 114, a first wiring 124 for an operation voltage Vcc or the ground voltage Vss to the charge-trapping well 114 is formed through the insulation interlayer 130. In particular, when the charge-trapping well 114 is doped with N type impurities, the operation voltage Vcc is applied to the charge-trapping well 114 through the first wiring 124 to drain the charges in the charge-trapping well 114. On the contrary, when the charge-trapping well 114 is doped with P type impurities, the ground voltage Vss is applied to the charge-trapping well 114 through the first wiring 124 to drain the charges in the charge-trapping well 114.

A second wiring 126 for draining charges in the charge-trapping patterns 116 is formed through the insulation interlayer 130. The second wiring 126 is electrically connected to the charge-trapping patterns 116. In particular, a voltage having a level substantially identical to that of a programming voltage, which is applied to the well 112 for a control gate electrode, is applied to the charge-trapping patterns 116 through the second wiring 126 to drain the charges in the charge-trapping patterns 116.

A third wiring (not shown) is electrically connected between the source region 110 of the access transistor and the ground well 128. A bit line (not shown) which is electrically connected to the first contact 124 is formed on the first contact 118. The first contact in turn is electrically connected to the drain region 110 of the access transistor. For applying a programming voltage to the well 112 for a control gate electrode, a word line (not shown) which is electrically connected to the second contact 120 is formed on the second contact and the second contact is in turn electrically connected to the well 112 for the control gate electrode. Here, the word line and the bit lines are arranged substantially perpendicular to each other. Also, a conductive line (not shown) for applying the ground voltage to the ground well 128 is formed on the third contact 122 which is electrically connected to the ground well 128.

Hereinafter, operations of the single-poly EEPROM structure 100 in accordance with the present exemplary embodiment are illustrated in detail.

A programming voltage of about 12.5V to about 15V is applied to the word line corresponding to a selected cell. Thus, the well 112 for a control gate electrode in the selected cell has a voltage substantially identical to the programming voltage. Also, the floating gate electrode 108 has a voltage of about 5V to about 7V.

As the floating gate electrode 108 has an increased voltage higher than a threshold voltage, the access transistor is turned on to allow current to flow from the source region to the drain region. Here, hot electrons having excess energy are injected into the floating gate electrode 108 through the gate insulation layer 106 so that the electrons are charged in the floating gate electrode 108.

Meanwhile, a first portion of the hot electrons having the excess energy is charged in the floating gate electrode 108. On the contrary, a second portion of the hot electrons are moved into a non-selected cell, adjacent to the selected cell, through the insulation interlayer 130. The charge-trapping patterns 116 that enclose the floating gate electrode 108 trap the second portion of the hot electrons that are moved through the insulation interlayer 130. Here, since the operation voltage Vcc is applied to the charge-trapping patterns 116, the trapped charges are drained out. Thus, the second portion of the hot electrons is not able to be moved into the floating gate electrode 108 in the non-selected cell.

Further, a third portion of the hot electrons is moved through the semiconductor substrate 105 under the drain region 110. The charge-trapping well 114 in the fourth active region 104d at an interface between the unit cells traps the third portion of the hot electrons. Here, since a voltage substantially identical to the programming voltage is applied to the charge-trapping well 114, the third portion of the hot electrons trapped in the charge-trapping well 114 is drained out. As a result, the hot electrons are not moved into the source/drain regions 110 and the floating gate electrode 108 of the access transistor in the non-selected cell.

Therefore, although the hot electrons having the excess energy are moved through the insulation interlayer or the semiconductor substrate, these hot electrons have little or no influence on the non-selected cell due to the trapping of the hot electrons with the charge-trapping patterns and the charge-trapping well. In other words, since the hot electrons are not moved into the non-selected cell in programming the selected cell, the threshold voltage of the access transistor in the non-selected cell is not changed, thereby suppressing a gate disturbance.

Figure 5:
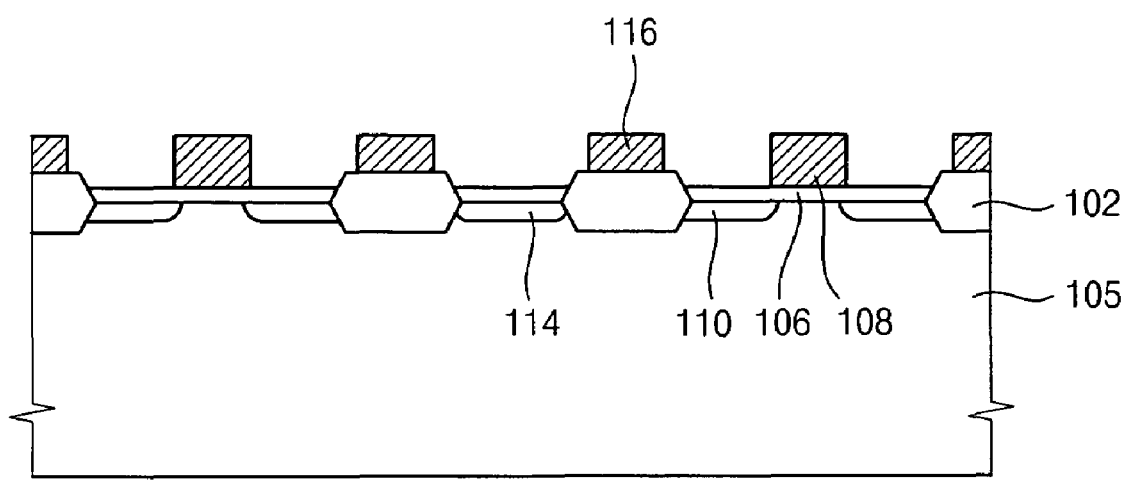
FIG. 5 is a cross sectional view illustrating a method of manufacturing the single-poly EEPROM device in FIG. 2.

FIG. 5 is a cross sectional view illustrating a method of manufacturing the single-poly EEPROM device in FIG. 2.

Referring to FIGS. 2 and 5, the isolation layers 102 are formed at a surface portion of the semiconductor substrate 105 by a Local Oxidation of Silicon (LOCOS) process or a trench isolation process to define the active region 104 and the field region of the semiconductor substrate 105. The active region 104 includes the first, second, third and fourth active regions 104a, 104b, 104c and 104d. The first, second and third active regions 104a, 104b and 104c are located in the unit cell. Also, the fourth active region 104d encloses the unit cell.

N-type impurities are implanted into the second active region 104b to form an N well (not shown) for a control gate electrode. P-type impurities are then implanted into the third active region 104c to form a P-well (not shown) for a ground.

The gate insulation layer 106 and a gate conductive layer (not shown) are sequentially formed on the semiconductor substrate 105. The gate conductive layer is patterned to form the floating gate electrode 108 and the charge-trapping pattern 116. Here, the floating gate electrode 108 is positioned over the first and second active regions 104a and 104b. Also, the charge-trapping pattern 116 is formed on the isolation layer 102 and also encloses the unit cell.

N-type impurities are implanted into the first, second and fourth active regions 104a, 104b and 104d to form the source/drain regions 110 in the first active region 104a, thereby completing the access transistor. Also, a contact region to be electrically connected to floating gate electrode 108 is defined in the second active region 104b. Further, the charge-trapping well 114 is formed in the fourth active region 104d.

Here, the charge-trapping well 114 is doped with P type impurities. Thus, a process for doping the fourth active region 104d with N-type impurities is omitted. When the charge-trapping well 114 is doped with P-type impurities, an additional process for doping the fourth active region 104d with P-type impurities is further performed. Alternatively, the fourth active region 104d is selectively doped with P type impurities with the third active region 104c being doped with P-type impurities.

Referring to FIGS. 2 to 4, the insulation interlayer 130 is formed on the semiconductor substrate 105 and the floating gate electrode 108. The first contact 118 which is electrically connected to the source/drain regions 110 is formed through the insulation interlayer 130. Moreover, the second contact 120 which is electrically connected to the well 112 is formed through the insulation interlayer 130. Further, the third contact (not shown) which is electrically connected to the ground well 128 is formed through the insulation interlayer 130.

The first wiring 124 which is electrically connected to the charge-trapping well 114 is formed through the insulation interlayer 130. The operation voltage or the ground voltage is applied to the charge-trapping well 114 through the first wiring 124 to drain the charges in the charge-trapping well 114.

The second wiring 126 which is electrically connected to the charge-trapping pattern 116 is formed through the insulation interlayer 130. A voltage is applied to the charge-trapping pattern 116 through the second wiring 126 to drain the charges in the charge-trapping pattern 116.

As described above, the charge-trapping pattern 116 may be formed simultaneously with the formation of the floating gate electrode 108. Also, the charge-trapping well 114 may be formed simultaneously with the formation of the source/drain regions 110. Thus, additional processes for forming the charge-trapping pattern 116 and the charge-trapping well 114 are not required. As a result, the gate disturbance is able to be suppressed without increasing the cost for manufacturing the semiconductor device.

Figure 6:
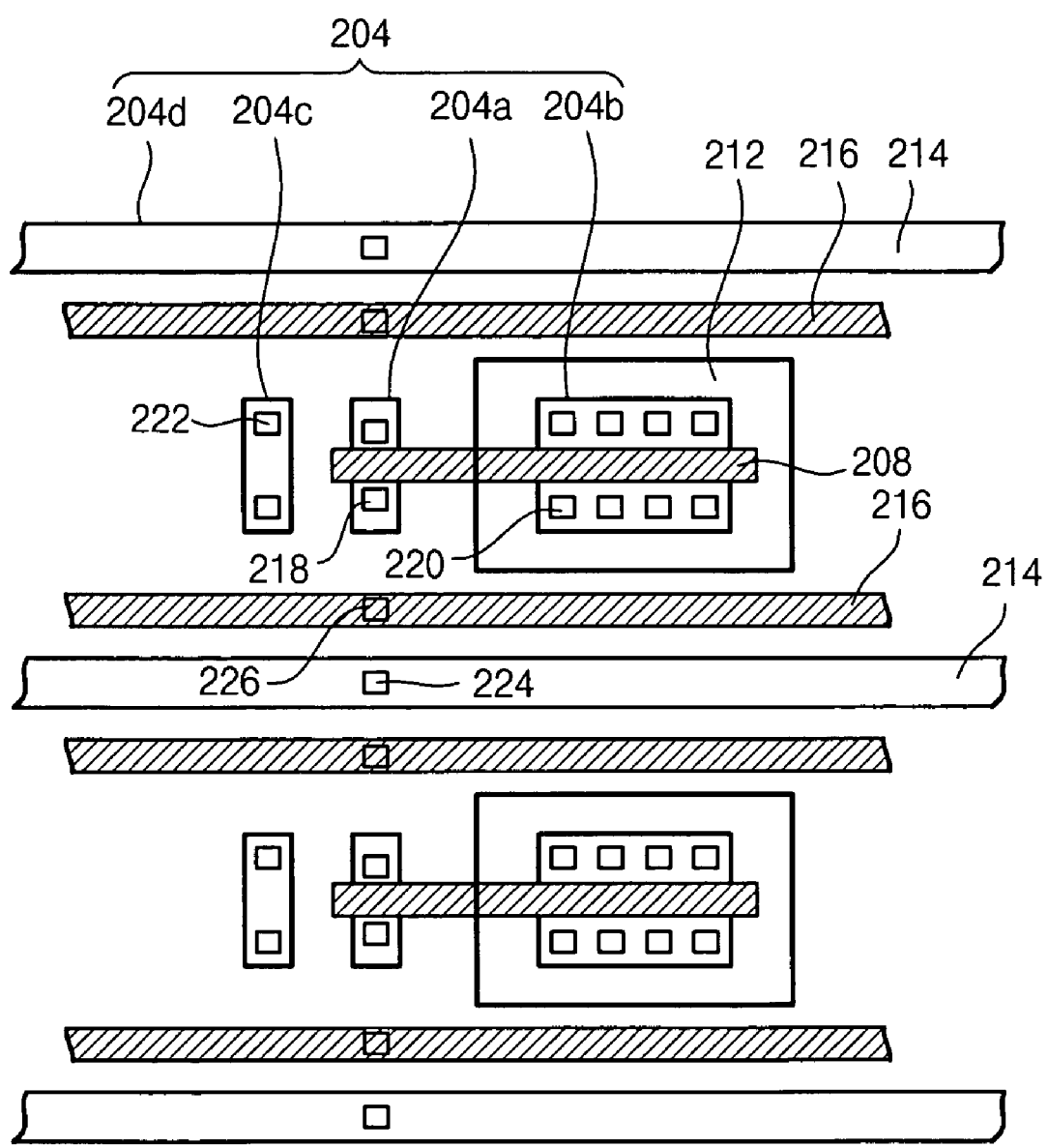
FIG. 6 is a plan view illustrating a single-poly EEPROM device in accordance with an exemplary embodiment of the present invention.

FIG. 6 is a plan view illustrating a single-poly EEPROM device in accordance with a second exemplary embodiment of the present invention.

A single-poly EEPROM device 200 includes elements substantially identical to those in Embodiment 1, except for a pattern for trapping a charge and a well for trapping a charge.

Referring to FIG. 6, charge-trapping patterns 216 are spaced apart from both sides of a floating gate electrode 208. In particular, the charge-trapping patterns 216 are arranged in a direction substantially parallel with a lengthwise direction of the floating gate electrode 208.

Also, fourth active regions 204d are spaced apart from outer side faces of the charge-trapping patterns 216, respectively. The fourth active regions 204d are arranged in a direction substantially parallel with the charge-trapping patterns 216. Thus, charge-trapping wells 214 are also substantially parallel with the lengthwise direction of the floating gate electrode 208.

Here, a gate disturbance of a cell may be generated between a selected cell and a non-selected cell that is positioned adjacent to the selected cell and along a direction substantially perpendicular to the lengthwise direction of the floating gate electrode 208. As a result, the charge-trapping patterns 216 and the charge-trapping wells 214, which are arranged in the direction substantially parallel with the lengthwise direction of the floating gate 208, are able to sufficiently suppress the occurrence of a gate disturbance. Also, since the charge-trapping patterns 216 and the charge-trapping wells 214 are not arranged in the direction substantially perpendicular to the lengthwise direction of the floating gate electrode 208, adjacent cells arranged along the direction substantially perpendicular to the lengthwise direction of the floating gate electrode 208 may have a narrow interval.

According to an exemplary embodiment, an insulation interlayer (see FIGS. 3 and 4) is formed on a substrate where the floating gate electrode 208 formed thereon to cover the floating gate electrode 208. As illustrated in FIG. 6, a first, second and third contacts 218, 220 and 222 are formed through the insulation interlayer. The first contact 218 applies a voltage to a source/drain region formed in a first active region 204a. The second contact 220 applies a voltage to a well 212 for a control gate electrode formed in a second active region 204b. Also, the third contact 222 applies a ground voltage to a ground well formed in the third active region 204c.

To drain charges in the charge-trapping well 214, a first wiring 224 for an operation voltage $V_{cc}$ or the ground voltage $V_{ss}$ to the charge-trapping well 214 is formed through the insulation interlayer. In particular, when the charge-trapping well 214 is doped with N type impurities, the operation voltage $V_{cc}$ is applied to the charge trapping well 214 through the first wiring 224 to drain the charges in the charge-trapping well 214. On the contrary, when the charge-trapping well 214 is doped with P type impurities, the ground voltage $V_{ss}$ is applied to the charge-trapping well 214 through the first wiring 224 to drain the charges in the charge-trapping well 214.

A second wiring 226 for drain charges in the charge-trapping pattern 216 is formed through the insulation interlayer. The second wiring 226 is electrically connected to the charge-trapping pattern 216. In particular, a voltage having a level substantially identical to that of a programming voltage, which is applied to the well 212 for a control gate electrode, is applied to the charge-trapping pattern 216 through the second wiring 226 to drain the charges in the charge-trapping pattern 216.

Figure 7:
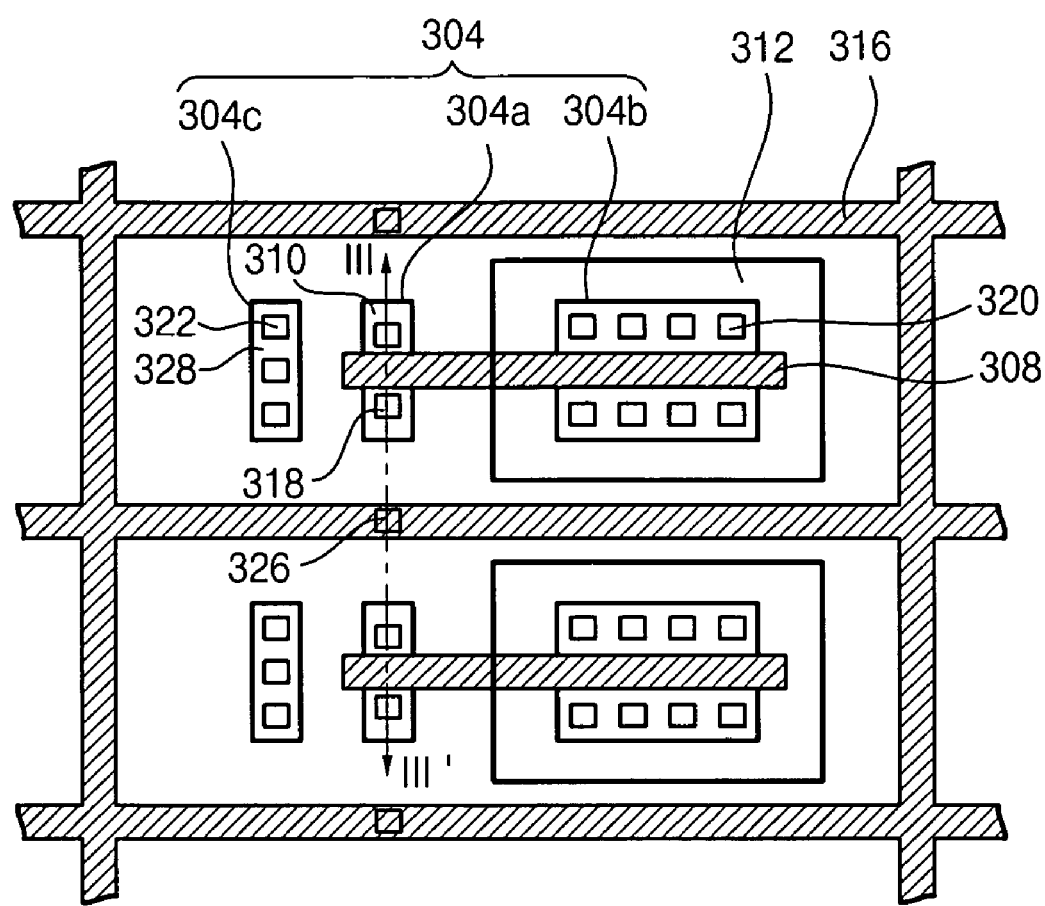
FIG. 7 is a plan view illustrating a single-poly EEPROM device in accordance with an exemplary embodiment of the present invention.
Figure 8:
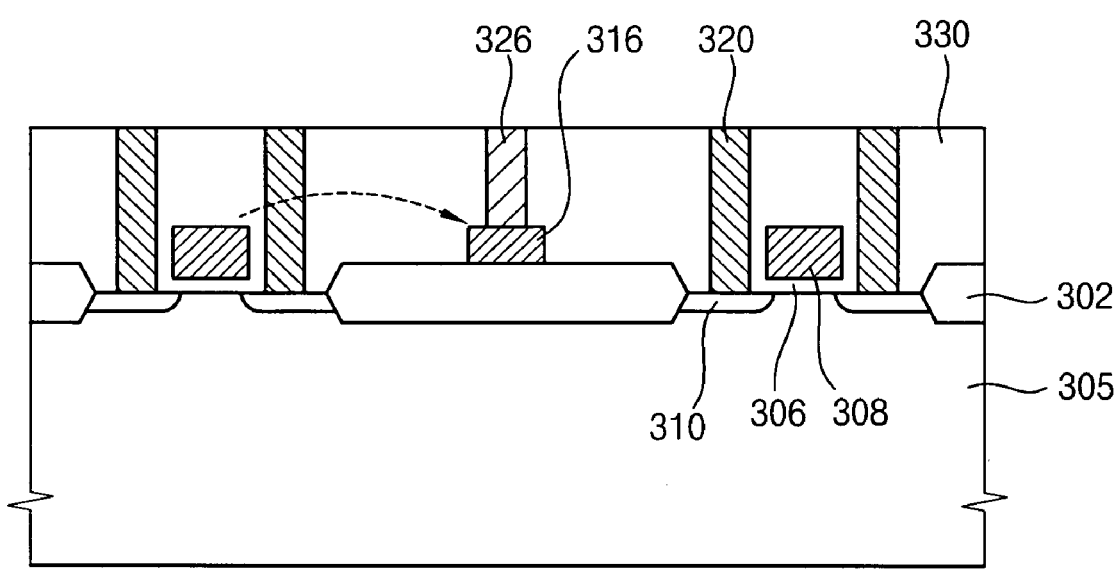
FIG. 8 is a cross sectional view taken along a line III-III' in FIG. 7.

FIG. 7 is a plan view illustrating a single-poly EEPROM device in accordance with a third exemplary embodiment of the present invention, and FIG. 8 is a cross sectional view taken along a line III-III' in FIG. 7.

Referring to FIGS. 7 and 8, isolation layers 302 are formed on a semiconductor substrate 305 to define an active region 304 and a field region of the semiconductor substrate 305. The active region 304 includes first, second and third isolated active regions 304a, 304b and 304c. The first, second and third active regions 304a, 304b and 304c are formed in each unit cell.

An access transistor is formed in the first active region 304a. The access transistor includes a gate structure and source/drain regions 310 formed in portions of the semiconductor substrate 305 between the gate structures. The gate structure includes a gate insulation layer 306 and a floating gate electrode 308. The access transistor corresponds to an N-type transistor.

A well 312 for a control gate electrode is formed in the second active region 304b. A voltage is applied to the floating gate electrode 308 through the well 312 for the control gate electrode in the second active region 304b. The well 312 is heavily doped with N type impurities.

The gate insulation layer 306 and the floating gate electrode 308 of the access transistor extend over the well 312 for the control gate electrode.

A ground well 328 is formed in the third active region 304c. The ground well 328 is doped with impurities having a conductive type different from that of the impurities in the source/drain regions 310. In the present exemplary embodiment, the ground well 328 is doped with P type impurities.

Charge-trapping patterns 316 are formed on the isolation layers 302. The charge-trapping patterns 316 are spaced apart from the floating gate electrode 308. In addition, the charge-trapping patterns 316 are arranged in a direction substantially parallel with a lengthwise direction of the floating gate electrode 308. The charge-trapping patterns 316 enclose each of the unit cells. Further, the charge-trapping patterns 316 include a conductive material. In particular, the charge-trapping patterns 316 may include a conductive material substantially identical to that of the floating gate electrode 308 of the access transistor.

An insulation interlayer 330 is formed on the floating gate electrode 308 and the semiconductor substrate 305. A first contact 318 for applying a voltage to the source/drain regions 310 and a second contact 320 for applying a voltage to the well 312 for a control gate electrode are formed through the insulation interlayer 330. Moreover, a third contact 322 for applying a ground voltage to the ground well 328 is electrically connected to the ground well 328.

A wiring 326 for draining charges in the charge-trapping patterns 316 is formed through the insulation interlayer 330. The wiring 326 is electrically connected to the charge-trapping patterns 316. In particular, a voltage having a level substantially identical to that of a programming voltage applied to the well 312 for a control gate electrode, is applied to the charge-trapping patterns 316 through the wiring 326 to drain the charges in the charge-trapping patterns 316.

The single-poly EEPROM device 300 of the present exemplary embodiment does not have a fourth active region between the unit cells. Thus, where insufficient space is provided for forming the fourth active region, the single-poly EEPROM device 300 of the present exemplary embodiment is particularly useful for this type of situation.

Hereinafter, a method of manufacturing the single-poly EEPROM 300 of the present exemplary embodiment is illustrated in detail.

Referring to FIGS. 7 and 8, the isolation layers 302 are formed at a surface portion of the semiconductor substrate 305 by a LOCOS process or a trench isolation process to define the active region 304 and the field region of the semiconductor substrate 305. The active region 304 includes the first, second and third active regions 304a, 304b and 304c. The first, second and third active regions 304a, 304b and 304c are located in the unit cell.

N-type impurities are implanted into the second active region 304b to form the N-well 312 for a control gate electrode. P-type impurities are then implanted into the third active region 304c to form the P-well 328 for a ground.

The gate insulation layer 306 and a gate conductive layer (not shown) are sequentially formed on the semiconductor substrate 305. The gate conductive layer is patterned to form the floating gate electrode 308 and the charge-trapping pattern 316. Here, the floating gate electrode 308 is positioned over the first and second active regions 304a and 304b. Also, the charge-trapping pattern 316 is formed on the isolation layer 302 and also encloses the unit cell.

N-type impurities are implanted into the first and second active regions 304a and 304b to form the source/drain regions 310 in the first active region 304a, thereby completing the access transistor. Also, a contact region for being electrically connected to the well 312 for a control gate electrode is defined in the second active region 304b.

The insulation interlayer 330 is then formed on the semiconductor substrate 305 and the floating gate electrode 308. The first, second and third contacts 318, 320 and 322 are formed through the insulation interlayer 330. The wiring 326 is formed through the insulation interlayer 330, thereby completing the single-poly EEPROM device 300 of the present exemplary embodiment.

Figure 9:
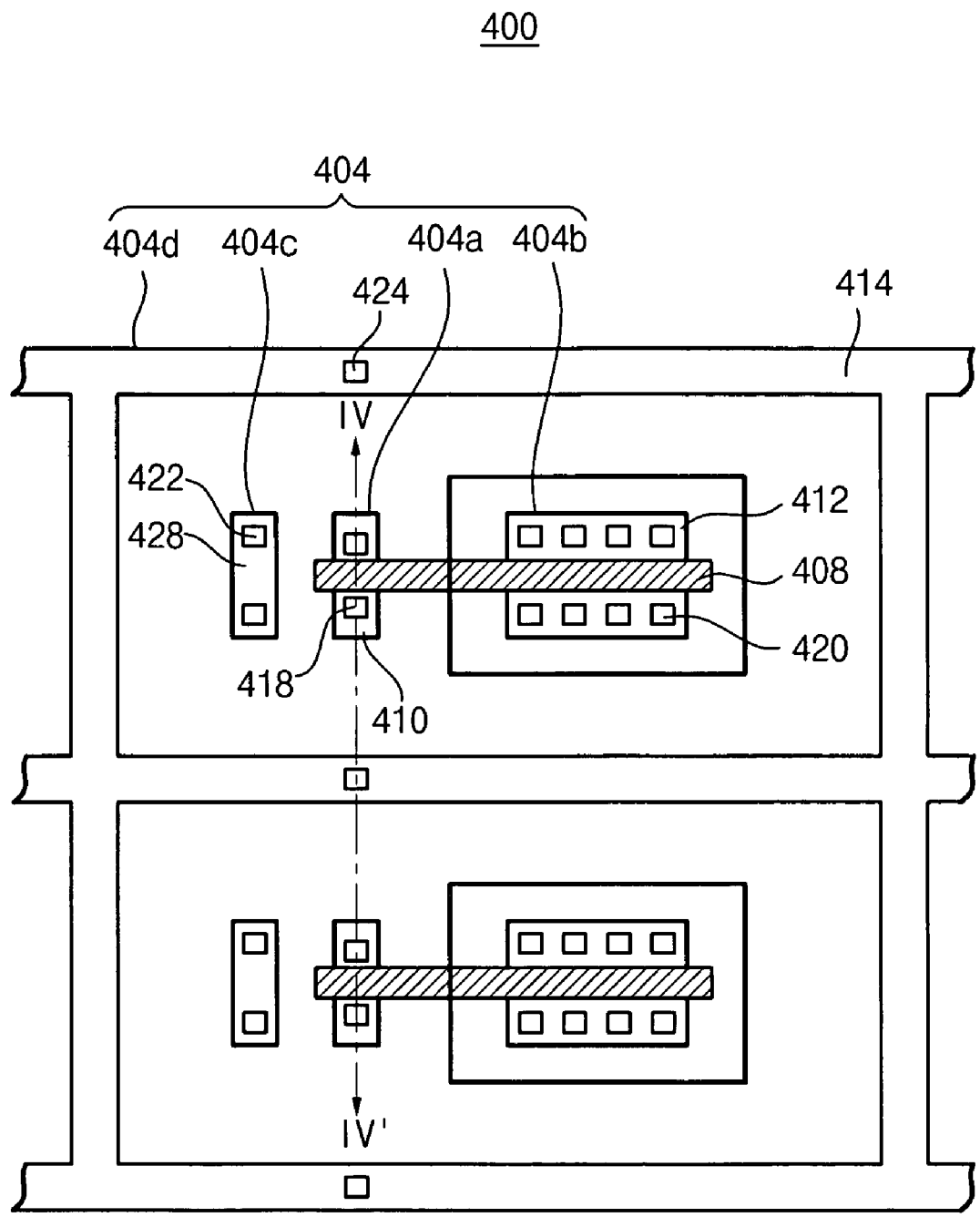
FIG. 9 is a plan view illustrating a single-poly EEPROM device in accordance with an exemplary embodiment of the present invention.
Figure 10:
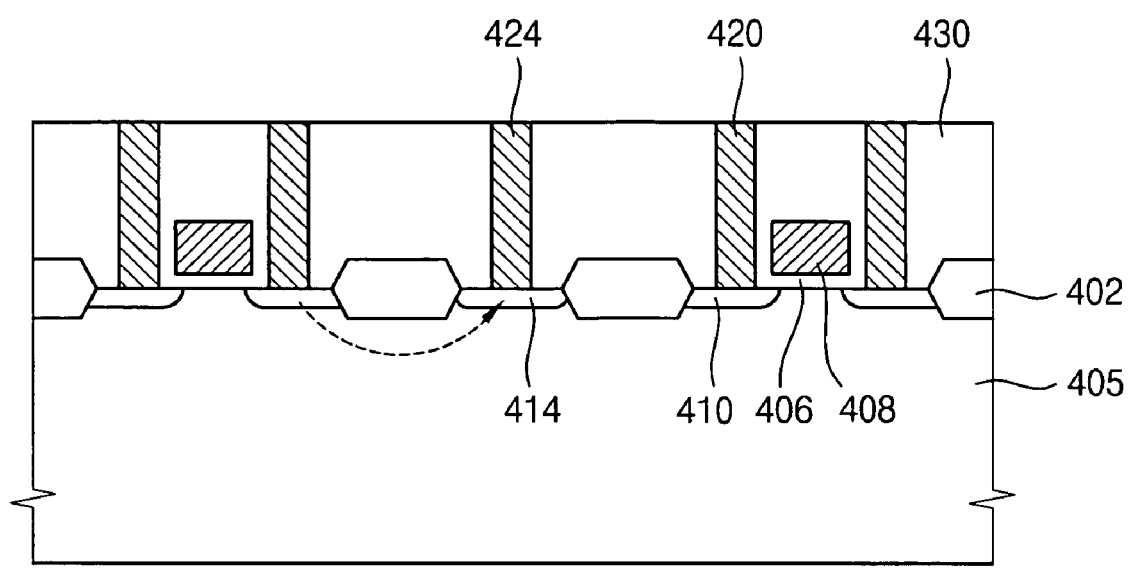
FIG. 10 is a cross sectional view taken along a line IV-IV' in FIG. 9.

FIG. 9 is a plan view illustrating a single-poly EEPROM device in accordance with a fourth exemplary embodiment of the present invention, and FIG. 10 is a cross sectional view taken along a line IV-IV' in FIG. 9.

Referring to FIGS. 9 and 10, isolation layers 402 are formed on a semiconductor substrate 405 to define an active region 404 and a field region of the semiconductor substrate 405. The active region 404 includes first, second, third and fourth isolated active regions 404a, 404b, 404c and 404d. The first, second and third active regions 404a, 404b and 404c are formed in each unit cell. The fourth active region 404d is formed between the unit cells. In particular, the fourth active region 404d encloses each of the unit cells. Alternatively, the fourth active region 404d may be arranged in a direction substantially parallel to a lengthwise direction of a floating gate electrode 408.

An access transistor is formed in the first active region 404a. The access transistor located in the first active region 404a includes a gate structure and source/drain regions 410 formed in portions of the semiconductor substrate 405 between the gate structures. The gate structure includes a gate insulation layer 406 and a floating gate electrode 408. Further, the access transistor corresponds to an N type transistor.

A well 412 for a control gate electrode is formed in the second active region 404b. A voltage is applied to the floating gate electrode 408 through the well 412 for the control gate electrode in the second active region 404b. The well 412 is heavily doped with N type impurities.

The gate insulation layer 406 and the floating gate electrode 408 of the access transistor extend over the well 412 for the control gate electrode.

A ground well 428 is formed in the third active region 404c. The ground well 428 is doped with impurities having a conductive type different from that of impurities in the source/drain regions 410.

A charge-trapping well 414 is formed in the fourth active region 404d. The charge-trapping well 414 traps hot electrons, which cross the isolation layer 402 under the surface of the semiconductor substrate 405. Among these trapped hot electrons are excess hot electrons that are generated in a selected cell during programming of the selected cell. Impurities are implanted into the fourth active region 404d to form the charge-trapping well 414. The impurities in the charge-trapping well 414 have a conductive type substantially identical to that of the impurities in the source/drain regions 410. Alternatively, the impurities in the charge-trapping well 414 have a conductive type different from that of impurities in the source/drain regions 410.

An insulation interlayer 430 is formed on the floating gate electrode 408 and the semiconductor substrate 405. A first contact 418 for applying a voltage to the source/drain regions 410 and a second contact 420 for applying a voltage to the well 412 for a control gate electrode are formed through the insulation interlayer 430. Also, a third contact 422 for applying a ground voltage to the ground well 428 is electrically connected to the ground well 428.

To drain charges in the charge-trapping well 414, a wiring 424 for an operation voltage Vcc or the ground voltage Vss to the charge-trapping well 414 is formed through the insulation interlayer 430.

The single-poly EEPROM device 400 of the present exemplary embodiment does not have a charge-trapping pattern. Thus, where the charge-trapping pattern is not readily formed due to a small area provided for the isolation layer 402 in defining the fourth active region 404d, the single-poly EEPROM device 400 of the present exemplary embodiment is particularly useful in this type of situation.

Hereinafter, a method of manufacturing the single-poly EEPROM device 400 of the present exemplary embodiment is illustrated in detail.

The isolation layers 402 are formed at a surface portion of the semiconductor substrate 405 by a LOCOS process or a trench isolation process to define the active region 404 and the field region of the semiconductor substrate 405. The active region 404 includes the first, second, third and fourth active regions 404a, 404b, 404c and 404d. The first, second and third active regions 404a, 404b and 404c are located in the unit cell. Also, the fourth active region 404d encloses the unit cell.

N-type impurities are implanted into the second active region 404b to form an N-well 412 for a control gate electrode. P-type impurities are then implanted into the third active region 404c to form a P-well 428 for a ground.

The gate insulation layer 406 and a gate conductive layer (not shown) are sequentially formed on the semiconductor substrate 405. The gate conductive layer is patterned to form the floating gate electrode 408. Here, the floating gate electrode 408 is positioned over the first and second active regions 404a and 404b.

N-type impurities are implanted into the first, second and fourth active regions 404a, 404b and 404d to form the source/drain regions 410 in the first active region 404a, thereby completing the access transistor. Also, a contact region to be electrically connected to the floating gate electrode 408 is defined in the second active region 404b. Further, the charge-trapping well 414 is formed in the fourth active region 404d.

The insulation interlayer 430 is then formed on the semiconductor substrate 405 and the floating gate electrode 408. The first, second and third contacts 418, 420 and 422 are formed through the insulation interlayer 430. The wiring 424 is formed through the insulation interlayer 430, thereby completing the single-poly EEPROM device 400 of the present exemplary embodiment.

According to exemplary embodiments of the present invention, when the selected cell is programmed, the excess hot electrons are drained through the charge-trapping structure so that the threshold voltage of the non-selected cell, adjacent to the selected cell, is not increased, thereby providing a single-poly EEPROM device having improved operational characteristics and reliability over conventional devices.

Further, since an additional process for forming the charge-trapping structure is not required, the cost of manufacturing the single-poly EEPROM device is not increased.

Having described the preferred embodiments of the present invention, it is further noted that it is readily apparent to those of reasonable skill in the art that various modifications may be made without departing from the scope and the spirit of the invention which is defined by the metes and bounds of the appended claims.

What is claimed is:

1. A semiconductor device comprising:
    at least two transistors; and
    a charge-trapping structure for trapping charges which are moved from a selected transistor toward a non-selected transistor adjacent to the selected transistor, wherein a threshold voltage of the non-selected transistor is prevented from being increased, wherein the charge-trapping structure comprises:
    an active region formed between the selected transistor and the non-selected transistor and defined by an isolation layer; and
    a charge-trapping well formed in the active region, the charge-trapping well being doped with impurities.

2. The semiconductor device of claim 1, wherein the charge-trapping well has a conductive type substantially identical to that of source/drain regions in the transistors.

3. The semiconductor device of claim 1, wherein the charge-trapping well has a conductive type different from that of source/drain regions in the transistors.

4. The semiconductor device of claim 1, further comprising a first wiring for applying an operation voltage or a ground voltage to the charge-trapping well to drain charges that are trapped in the charge-trapping well.

5. The semiconductor device of claim 1, wherein the charge-trapping structure further comprises:
    a charge-trapping pattern formed on the isolation layer.

6. The semiconductor device of claim 5, wherein the charge-trapping pattern comprises a material substantially identical to that of a gate electrode in the transistors.

7. The semiconductor device of claim 5, further comprising a wiring for applying a voltage to the charge-trapping pattern to drain charges that are trapped in the charge-trapping pattern.

8. A semiconductor device comprising:
    at least two transistors; and
    a charge-trapping structure for trapping charges which are moved from a selected transistor toward a non-selected transistor adjacent to the selected transistor, wherein a threshold voltage of the non-selected transistor is prevented from being increased, wherein the charge-trapping structure comprises:
    an isolation layer formed between the selected transistor and the non-selected transistor; and
    a charge-trapping pattern formed on the isolation layer.

9. The semiconductor device of claim 8, wherein the charge-trapping pattern comprises a material substantially identical to that of a gate electrode in the transistors.

10. The semiconductor device of claim 8, further comprising a wiring for applying a voltage to the charge-trapping pattern to drain charges that are trapped in the charge-trapping pattern.

11. A semiconductor device comprising:
a plurality of unit cells comprising access transistors and wells for a control gate electrode spaced apart from the access transistors, said wells for applying a voltage to a gate electrode of the access transistors; and
a charge-trapping structure for trapping charges, which are moved from a selected unit cell toward a non-selected unit cell, adjacent to the selected unit cell, wherein a threshold voltage of the access transistor in the non-selected unit cell is prevented from being increased.

12. The semiconductor device of claim 11, wherein the gate electrode of the access transistors extends over the well for the control gate electrode.

13. The semiconductor device of claim 11, wherein the charge-trapping structure comprises:
an active region formed between the selected unit cell and the non-selected unit cell and defined by an isolation layer; and
a charge-trapping well formed in the active region, the charge-trapping well being doped with impurities.

14. The semiconductor device of claim 13, wherein the charge-trapping well has a conductive type substantially identical to that of source/drain regions in the transistors.

15. The semiconductor device of claim 13, wherein the charge-trapping well has a conductive type different from that of source/drain regions in the transistors.

16. The semiconductor device of claim 13, further comprising a first wiring for applying an operation voltage or a ground voltage to the charge-trapping well to drain charges that are trapped in the charge-trapping well.

17. The semiconductor device of claim 13, wherein the charge-trapping well encloses each of the unit cells.

18. The semiconductor device of claim 11, wherein the charge-trapping structure comprises:
an active region formed between the selected unit cell and the non-selected unit cell and defined by an isolation layer;
a charge-trapping well formed in the active region, the charge-trapping well being doped with impurities; and
a charge-trapping pattern formed on the isolation layer.

19. The semiconductor device of claim 18, further comprising a first wiring for applying an operation voltage or a ground voltage to the charge-trapping well to drain charges that are trapped in the charge-trapping well.

20. The semiconductor device of claim 18, wherein the charge-trapping well encloses each of the unit cells.

21. The semiconductor device of claim 18, wherein the charge-trapping pattern comprises a material substantially identical to that of a gate electrode in the access transistor.

22. The semiconductor device of claim 18, further comprising a wiring for applying a voltage to the charge-trapping pattern to drain charges that are trapped in the charge-trapping pattern.

23. The semiconductor device of claim 18, wherein the charge-trapping pattern encloses the unit cell, and the charge-trapping well encloses the charge-trapping pattern.

24. The semiconductor device of claim 11, wherein the charge-trapping structure comprises:
an isolation layer formed between the selected unit cell and the non-selected unit cell; and
a charge-trapping pattern formed on the isolation layer.

25. The semiconductor device of claim 24, wherein the charge-trapping pattern comprises a material substantially identical to that of a gate electrode in the transistors.

26. The semiconductor device of claim 24, further comprising a wiring for applying a voltage to the charge-trapping pattern to drain charges that are trapped in the charge-trapping pattern.

* * * * *